United States Patent
Choi et al.

(10) Patent No.: US 6,858,062 B2
(45) Date of Patent: Feb. 22, 2005

(54) RESIDUAL GAS REMOVING DEVICE AND METHOD THEREOF

(75) Inventors: Chul-Hwan Choi, Seoul (KR); Jin-Ho Jeon, Seoul (KR); Yong-Gab Kim, Suwon (KR); Jong-Seung Yi, Suwon (KR); Min-Woo Lee, Seoul (KR); Kyung-Tae Kim, Suwon (KR); Chan-Hyung Cho, Whasong-gun (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 78 days.

(21) Appl. No.: 10/046,282

(22) Filed: Jan. 16, 2002

(65) Prior Publication Data

US 2002/0092281 A1 Jul. 18, 2002

(30) Foreign Application Priority Data

Jan. 18, 2001 (KR) .......................................... 2001-2814

(51) Int. Cl.[7] ............................................. B01D 53/04
(52) U.S. Cl. ................... 95/25; 95/90; 96/108; 96/417
(58) Field of Search ........................... 95/1, 23, 25, 90; 96/108, 109, 417

(56) References Cited

U.S. PATENT DOCUMENTS

| 4,561,865 | A | * | 12/1985 | McCombs et al. | 95/96 |
|---|---|---|---|---|---|
| 4,857,086 | A | * | 8/1989 | Kawai | 96/1 |
| 5,238,469 | A | * | 8/1993 | Briesacher et al. | 96/108 |
| RE34,434 | E | * | 11/1993 | Campbell et al. | 96/110 |
| 5,334,237 | A | * | 8/1994 | Lorimer | 96/103 |
| 6,068,685 | A | * | 5/2000 | Lorimer et al. | 96/112 |
| 6,168,645 | B1 | * | 1/2001 | Succi et al. | 96/111 |
| 6,196,050 | B1 | * | 3/2001 | Ikeda et al. | 96/108 |
| 6,514,313 | B1 | * | 2/2003 | Spiegelman et al. | 96/109 |
| 6,536,460 | B1 | * | 3/2003 | Yelverton et al. | 137/240 |

* cited by examiner

*Primary Examiner*—Minh-Chau T. Pham
(74) *Attorney, Agent, or Firm*—Volentine Francos & Whitt, PLLC

(57) ABSTRACT

A residual gas removing device for a gas supply apparatus in a semiconductor fabricating facility, includes a low stress valve disposed between a mass flow controller and a chamber. The low stress valve alternately supplies or cuts off a gas from the mass flow controller to the chamber. A WF6 gas removing apparatus is in flow communication with a gas inlet line of the low stress valve to remove a residual WF6 gas in the gas inlet line, before proceeding with a subsequent deposition step.

1 Claim, 3 Drawing Sheets

FIG. 3

| | Step Name | Time (sec) | Press (mtorr) | HIVAC | BsAr | SiH$_4$ | DCS | 4Ar | 5Ar | WF$_6$ | VALVE OPEN |
|---|---|---|---|---|---|---|---|---|---|---|---|
| 1 | P/D | 20 | 0 | E | 50(v) | 0 | 0 | 50(v) | 50(v) | 0 | UV1,4,5 VV1,4,5 LSV |
| 2 | Heat Up | 20 | 300 | D | 50 | 0 | 0 | 500 | 500 | 0 | UV1,4,5 DV1,4,5 LSV |
| 3 | Heat Up | 30 | 300 | D | | 0 | 0 | 500 | 500 | 0 | UV1,4,5 DV1,4,5 LSV |
| 4 | SiH$_4$ vent | 3 | 300 | D | 50 | 300(v) | 0 | 500 | 500 | 0 | UV1,2,4,5 DV1,4,5 VV2 LSV |
| 5 | SiH$_4$ flush | 40 | 300 | D | 50 | 300 | 0 | 200 | 200 | 0 | UV1,2,4,5 DV1,2,4,5 LSV |
| 6 | P/D | 20 | 0 | E | 0 | 0 | 0 | 0 | 0 | 0 | |
| 7 | DCS vent | 5 | 0 | E | 50(v) | 0 | 50(v) | 50(v) | 50(v) | 0 | UV1,3,4,5 VV1,3,4,5 LSV |
| 8 | DCS flush | 10 | 120 | D | 100 | 0 | 106 | 500 | 300 | 5.5(v) | UV1,3,4,5,6 DV1,3,4,5 VV6 LSV |
| 9 | Nucleation | 12 | 120 | D | 100 | 0 | 106 | 500 | 300 | 5.5 | UV1,3,4,5,6 DV1,3,4,5,6 LSV |
| 10 | Bulk | 20 | 120 | D | 100 | 0 | 185 | 500 | 300 | 13 | UV1,3,4,5,6 DV 1,3,4,5,6 LSV |
| 11 | DCS Post | 3 | 120 | D | 100 | 0 | 175 | 500 | 300 | 0 | UV1,3,4,5 DV1,3,4,5 LSV |
| 12 | Ar Purge | 15 | 120 | D | 100 | 0 | 0 | 500 | 5000 | 0 | UV1,4,5 DV1,4,5 LSV |
| 13 | P/D | 15 | 0 | E | 0 | 0 | 0 | 0 | 0 | 0 | |
| 14 | SiH Post | 3 | 120 | D | 100 | 300 | 0 | 500 | 200 | 0 | UV1,2,4,5 DV1,2,4,5 LSV |
| 15 | P/D | 30 | 0 | E | 0 | 0 | 0 | 0 | 0 | 0 | |

Note:
MFC1,2,3,4 and MFC5,6,8 are divided into GAS BOX A and B.
GAS flowing out of GAS BOX A and B joins one GAS LINE and is again divided into INNER and OUTER NIDDLE V/V.
INNER NIDDLE V/V is FULL OPENDE, OUTER NIDDLE V/V is controlide in the range of 15 to 25mm to maintain UNIFORMITY
(v) is vented through VENT VALVE.
HIVAC(E) is pumped by turbo pump, puming (1) is dry-pumped by dry-pump without turbo-pump.

RESIDUAL GAS REMOVING DEVICE AND METHOD THEREOF

BACKGROUND OF THE INVENTION

1. Field of the Invention

The present invention relates to a residual gas removing device in a gas supply apparatus used in a semiconductor manufacturing facility, and more particularly, to a residual gas removing device for removing a WF6 gas remaining in the gas lines of the gas supply apparatus.

2. Description of the Related Art

In general, a tungsten silicide film is grown via a reaction between dichloro silane and WF6 gas in a so-called Diclor Siliden (DCS) WSix process. The tungsten silicide WSix film is formed and patterned on a polysilicon film, thereby forming low resistance bitlines and wordlines which are connected in parallel to the polysilicon layer.

In the course of fabricating such wiring, a problem has occurred in which the adhesion force of the WSix film on the polysilicon film is reduced and the two films are subject to delamination, whereby the two films come apart due to a difference in stress between the two films. Delamination occurs, for example, during a heat treatment performed in a BPSG reflow process in an environment having a temperature of 830° C. and a pressure of 30". Delamination may also occur during an SiN deposition process having a temperature of 1100° C.

Accordingly, it is necessary to prevent such a delamination phenomenon from occurring during the formation of the WSix film. One way to prevent the delamination is to reduce the tungsten-rich environment during the WSix formation process. If the WF6 gas is removed after the main deposition step, the ratio of tungsten (W) and silicon (Si) is changed and the amount of tungsten can be reduced. In other words, the tungsten-rich (W-rich) phenomenon can be prevented by removing WF6 gas after the main deposition process, thereby resulting in the formation of a low-stress film and being able to control defects in the films.

FIG. 1 is a schematic view showing the structure of a gas supply apparatus in a conventional semiconductor fabricating facility. The gas supply apparatus includes a main gas can 10, which can supply various gases, for example, dichloro silane (DSC) gas, and a WF6 gas supply can 20 to supply a WF6 gas.

The first valve group 30, comprising valves SV2–SV8, removes air in each of the supplied gas lines. The second valve group 40 comprises eight up-stream valves UV1 to UV8. The second valve group 40 serves to shut off the WF6 gas can 20, or any of the various gases from the main gas can 10, during the change of a mass flow controller (MFC) group 60. The controller group 60 comprises mass flow controllers (MFC) MF1 to MF8 to control gas pressure in each of the gas lines. The third valve group 50 comprises eight purge valves PV1 to PV8 to purge gases remaining in each of the gas lines during changes in the MFC group. The fourth valve group 70 comprises eight vent valves VV1 to VV8, to vent the residual gas in each of the gas lines. The fifth valve group 80 comprises eight down-stream valves DV1 to DV8 to shut off gases from the gas lines connected to the chamber 90, thereby preventing the gas from flowing outside during the change of the mass flow controllers (MFC). The low stress valve 100 regulates (i.e., supplies or cuts off) gases being supplied from MF5 to MF8 of the MFC group 60.

The gas supply apparatus further includes inner needle vent valve 91 and outer needle vent valve 92 at the entrance of the chamber 90. When the inner needle vent valve 91 is full opened, WSix film uniformity is controlled according to whether the outer needle vent valve 92 is opened or closed, and the thickness of WSix film is controlled by the deposition time. The shower head of the inner needle vent valve 91 is divided into an inner zone and an outer zone, and the amount of gas out-flowing through each of the inner zone and the outer zone is controlled to ensure film uniformity.

For completeness, MPVA and MPVB identify main purge valves A and B, and MVVA and MVVB identify main vent valves A and B, respectively.

This conventional gas supply apparatus has a problem in that the WF6 gas, which is used in a main deposition process, remains in the gas line 81 (i.e., the gas inlet line to the low stress valve 100), and then during a subsequent process, flows into the chamber 90 with a carrier gas such as argon gas (Ar) through the low stress valve 100. Because of this residual gas, the amount of tungsten is increased on a wafer surface (W-rich phenomenon), which in turn increases the stress between the films, causing delamination.

SUMMARY OF THE INVENTION

In order to solve these and other problems of the conventional art, an object of the present invention is to provide a residual gas removing device for a gas supply apparatus in which any WF6 gas remaining in the gas lines is vented after a main deposition process, thereby reducing wafer stress.

In order to achieve the above object and other objects, the present invention provides a residual gas-removing device for a gas supply apparatus in a semiconductor fabricating facility, the residual gas removing device including a low stress valve disposed between a mass flow controller and a chamber, the low stress valve being operative for cutting off or supplying a gas from the mass flow controller to the chamber. A WF6 gas removing apparatus is in flow communication with a gas inlet line of the low stress valve to remove a residual WF6 gas in the gas inlet line.

Preferably, the WF6 gas removing apparatus includes a fore line vent valve connected to the gas inlet line of the low stress valve to vent the residual WF6 gas in the gas line, and a pump connected to the fore line vent valve for pumping the residual WF6 gas through the fore line vent valve.

BRIEF DESCRIPTION OF THE DRAWINGS

The above objects and other advantages of the present invention will become more apparent by describing in detail preferred embodiments thereof with reference to the attached drawings in which:

FIG. 3 is a flow chart of the method of operation of the residual gas removing device shown in FIG. 2 according to an embodiment of the present invention.

DETAILED DESCRIPTION OF THE PREFERRED EMBODIMENT

The present invention will now be described more fully with reference to the accompanying drawings, in which a preferred embodiment of the invention is shown. This invention may, however, be embodied in many different forms and should not be construed as being limited to the embodiments set forth herein. Rather, the embodiments are provided so that this disclosure will be thorough and complete, and will fully convey the concept of the invention to those skilled in the art. Like numerals represent like elements.

Figure 2:
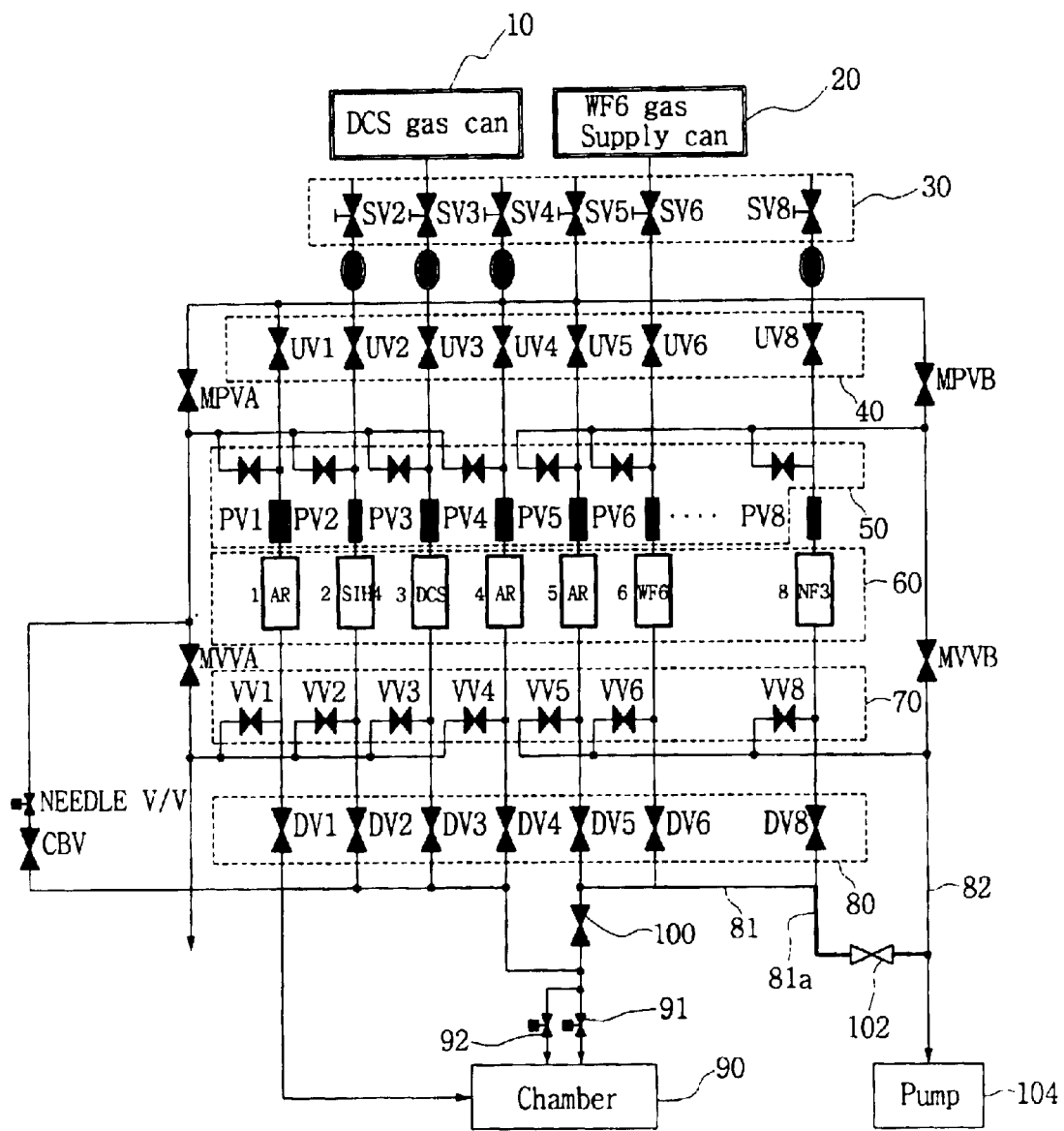
FIG. 2 is a schematic diagram of a residual gas removing device for a gas supply apparatus according to the present invention, that can be employed in a semiconductor fabricating facility.

FIG. 2 is a schematic diagram of a residual gas removing device for a gas supply apparatus according to the present invention, that can be employed in a semiconductor fabricating facility.

Figure 1:
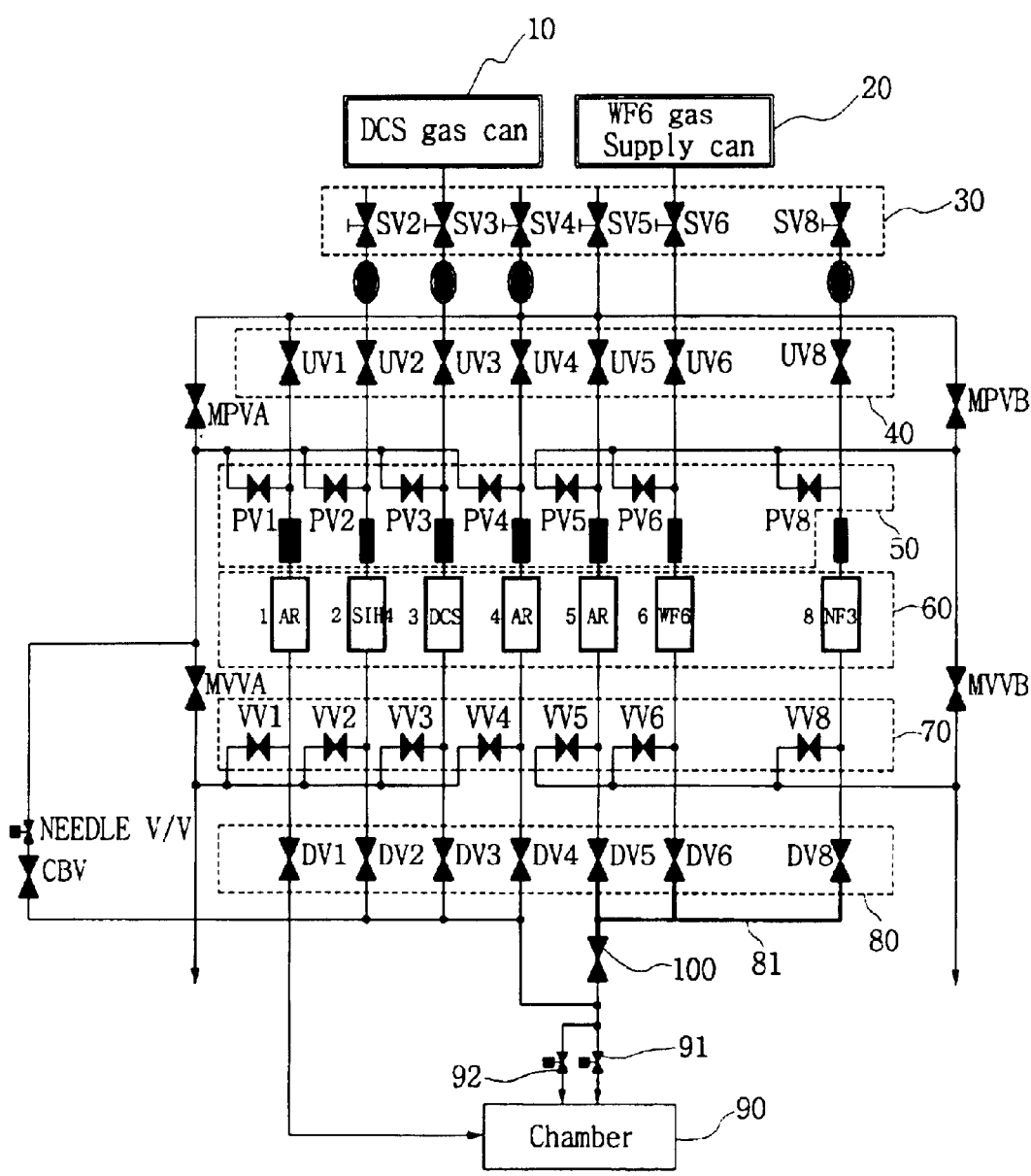
FIG. 1 is a schematic diagram of a conventional gas supply apparatus used in a semiconductor fabricating facility.

Similar to FIG. 1, the gas supply apparatus includes a main gas can 10, which can supply various gases, for example, dichloro silane (DSC) gas, and a WF6 gas supply can 20 to supply a WF6 gas.

The first valve group 30, comprising valves SV2–SV8, removes air in each of the supplied gas lines. The second valve group 40 comprises eight up-stream valves UV1 to UV8. The second valve group 40 serves to shut off the WF6 gas can 20, or any of the various gases from the main gas can 10, during the change of a mass flow controller (MFC) group 60. The controller group 60 comprises mass flow controllers (MFC) MF1 to MF8 to control gas pressure in each of the gas lines. The third valve group 50 comprises eight purge valves PV1 to PV8 to purge gases remaining in each of the gas lines during changes in the MFC group. The fourth valve group 70 comprises eight vent valves VV1 to VV8, to vent the residual gas in each of the gas lines. The fifth valve group 80 comprises eight down-stream valves DV1 to DV8 to shut off gases from the gas lines connected to the chamber 90, thereby preventing the gas from flowing outside during the change of the mass flow controllers (MFC). The low stress valve 100 regulates (i.e., supplies or cuts off) gases being supplied from MF5 to MF8 of the MFC group 60.

The gas supply apparatus further includes inner needle vent valve 91 and outer needle vent valve 92 at the entrance of the chamber 90. When the inner needle vent valve 91 is full opened, WSix film uniformity is controlled according to whether the outer needle vent valve 92 is opened or closed, and the thickness of WSix film is controlled by the deposition time. The shower head of the inner needle vent valve 91 is divided into an inner zone and an outer zone, and the amount of gas out-flowing through each of the inner zone and the outer zone is controlled to ensure film uniformity.

Recall that with the conventional gas supply apparatus, the WF6 gas used in a main deposition process remained in the gas line 81, and then during a subsequent process, the remaining gas flowed into the chamber 90 with a carrier gas such as argon gas (Ar) through the low stress valve 100. This tended to increase the amount of tungsten on a wafer surface (W-rich phenomenon), which increased the stress between the films, causing delamination.

In response, unlike FIG. 1, the embodiment of FIG. 2 in accordance with the present invention includes a fore line vent valve 102 connected to the gas line 81, through which the residual WF6 gas is vented from the gas line 81 after a main deposition step, and toward the fore line 82 in order to remove the WF6 gas remaining in the gas line 81. The fore line 82 is connected to the fore line vent valve 102 and a pump 104. The pump 104 is used to pump the residual WF6 gas from the gas line 81, through the fore line vent valve 102, and out to the fore line 82.

FIG. 3 is a flow chart of the method of operation of the residual gas removing device shown in FIG. 2. The Diclor Siliden (DCS) WSix process comprises 15 steps as shown in FIG. 3. In each of the steps, the Step Name, Duration (time), Pressure, Pumping Mechanism, Gas Flows (BsAr, DCS, 4Ar, etc.), and Valve Positions are identified, and are thus not restated here for simplicity.

Of particular significance to the present invention, the low stress valve LSV (100) is closed after the tenth step "bulk step" which corresponds to the main deposition step. After the LSV 100 is closed, the pump 104 is activated to open the fore line vent valve 102, thereby removing the residual WF6 gas in the gas line 81. The fore vent line 102 may be directly connected to the gas inlet line 81, or connected to an additional interim gas line 81a, which in turn is connected to the gas inlet line 81.

There are many ways to vent the gas after it is removed from the gas line 81. By way of example and not limitation, in the foregoing description, the residual WF6 gas in the gas line 81 was vented through the fore line vent valve 102 disposed in the gas line 81. The residual WF6 gas in the gas line 81 can also be vented and removed through a bypass valve (similar in arrangement to the fore line vent valve) connected to the manifold line of the low stress valve 100. Still further, a manifold line of the low stress valve 100 can be connected to the fore line 82 in order to remove the residual WF6 gas in the gas line 81 using Ar, $N_2$, or inert gas. In another embodiment, the manifold line of the low stress valve 100 may be connected to a pneumatic valve (similar in arrangement to the fore line vent valve) in order to remove the residual WF6 gas in the gas line 81.

As described above, the WF6 gas is supplied to the chamber in a main deposition step and thereafter the residual WF6 gas remaining in the gas line connected to the low stress valve is vented and removed, thereby preventing the residual WF6 gas in the gas line from flowing into the chamber with a carrier gas such as Ar in a subsequent step.

While the invention has been described in detail in terms of specific embodiments, those skilled in the art will recognize that the invention can be practiced with various modifications or changes within the spirit and scope of the appended claims.

What is claimed is:

1. A method of forming a tungsten silicide film, comprising:

disposing a substrate in a process chamber, the substrate having a film thereon comprising silicon;

subsequently opening a low stress valve having an outlet end connected to the process chamber, and an inlet end connected to a plurality of sources of gas via a gas inlet line, the sources of gas including a source of WF6 gas and a source of an inert carrier gas;

controlling the flow of the WF6 gas through the open low stress valve and into the process chamber using a mass flow controller disposed between the gas inlet line and the source of WF6 gas;

subsequently closing the low stress valve to cut off the supplying of the WF6 gas into the process chamber;

subsequently venting the gas inlet line to remove residual WF6 gas therefrom; and subsequently opening the low stress valve, and allowing the inert carrier gas to flow therethrough into the process chamber.

\* \* \* \* \*